(12) United States Patent
Nguyen

(10) Patent No.: US 6,259,283 B1
(45) Date of Patent: Jul. 10, 2001

(54) CLOCK DOUBLER CIRCUIT AND METHOD

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/493,856

(22) Filed: Jan. 28, 2000

Related U.S. Application Data

(63) Continuation-in-part of application No. 09/427,143, filed on Oct. 25, 1999.

(51) Int. Cl.[7] .................................................. H03B 19/00
(52) U.S. Cl. .......................... 327/122; 327/175; 327/263; 327/271; 327/291; 365/233.5
(58) Field of Search .................................... 327/113, 114, 327/119–122, 175, 172, 176, 291, 261–263, 269, 271, 277, 161; 375/371, 238, 239; 365/233, 233.5

(56) References Cited

U.S. PATENT DOCUMENTS

| | | | |
|---|---|---|---|
| 5,245,637 | 9/1993 | Gersbach et al. | 375/374 |
| 5,537,069 | 7/1996 | Volk | 327/149 |
| 5,994,938 | 11/1999 | Lesmeister | 327/277 |
| 6,040,726 | 3/2000 | Martin | 327/175 |
| 6,100,735 | * 8/2000 | Lu | 327/158 |

OTHER PUBLICATIONS

Xilinx Application Note, "Using the Virtex Delay–Locked Loop", XAPP132, Oct. 21 1998 (Version 1.31).

* cited by examiner

*Primary Examiner*—Timothy P. Callahan
*Assistant Examiner*—Minh Nguyen
(74) *Attorney, Agent, or Firm*—Lois D. Cartier

(57) ABSTRACT

A clock doubler circuit and method that accept an input clock signal and provide therefrom an output clock signal having twice the frequency of the input clock signal. One circuit according to the invention includes an input clock terminal supplying a input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that is most nearly 90 degrees offset from the input clock signal. The selected clock signal is then combined with the input clock signal in an output clock generator to generate an output clock signal having twice the frequency of the input clock signal. In one embodiment, the clock doubler circuit includes a delay stage comprising a delay element that can selectively add a half-unit delay to the input clock signal.

27 Claims, 6 Drawing Sheets

CLOCK DOUBLER CIRCUIT AND METHOD

CROSS-REFERENCE TO RELATED APPLICATIONS

This application is a continuation-in-part application of commonly assigned, U.S. patent application Ser. No. 09/427,143 invented by Andy T. Nguyen, entitled "DUTY CYCLE CORRECTION CIRCUIT AND METHOD" and filed Oct. 25, 1999, which is incorporated herein by reference.

FIELD OF THE INVENTION

The invention relates to integrated circuits (ICs). More particularly, the invention relates to a clock doubler circuit and method for an IC.

BACKGROUND OF THE INVENTION

Clock signals are used in virtually every IC and electronic system to control timing. For example, every time there is a rising edge on a clock signal, all the flip-flops in a circuit may change state. Clearly, the higher the frequency of the clock signal, the faster the circuit operates. Therefore, where performance is an issue, circuit designers usually prefer to use the fastest available clock that can be supported by the delays on the logic paths through the circuit. In other words, the performance of a circuit is typically limited by the logic delays on the slowest logic path. However, sometimes the longest path delay through the circuit is significantly shorter than the period of the available clock, and the frequency of the available clock becomes the limiting factor.

To overcome this limitation, circuit designers can double the frequency of a clock signal using a phase-lock loop (PLL) or delay-lock loop (DLL) circuit. However, PLL and DLL circuits consume a great deal of silicon area. Additionally, PLLs are often analog in nature and take an extremely long time to simulate, and a design that works in one manufacturing process may stop working when manufactured using another process. Therefore, PLLs are very difficult to design, and often are not feasible in a given circuit or system. DLLs are also very complicated and difficult to design. Therefore, clock doubling is often not feasible using known circuits and methods.

Therefore, it is desirable to provide a circuit and method that enables a circuit designer to double the frequency of an input clock without using a PLL or DLL, using a fairly simple circuit that consumes a relatively small amount of silicon area.

SUMMARY OF THE INVENTION

The invention provides a clock doubler circuit and method that accept an input clock signal and provide therefrom an output clock signal having a frequency twice that of the input clock signal. One circuit according to the invention includes an input clock terminal supplying an input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that is most nearly 90 degrees offset from the input clock, i.e., the clock signal subject to a delay about equal to half of one input clock pulse (e.g., closest to but not exceeding half of one high pulse). The input clock signal is appropriately delayed to compensate for the delay through the clock multiplexer, then combined with the selected clock signal in an output clock generator that provides an output clock signal having a frequency twice that of the input clock signal. (In another embodiment, the intermediate clock signal selected by the clock multiplexer is the intermediate clock signal subject to a delay closest to and exceeding half of one input clock pulse.)

The multiplexer control circuit essentially counts the number of unit delays between first (e.g., rising) and second (e.g., falling) edges of the input clock signal. This total number of unit delays is divided by two, thus supplying the desired number of unit delays required to delay the input clock signal by 90 degrees. This number is used to select the correct intermediate clock signal, e.g., the clock signal subject to a delay closest to but not exceeding half of one input clock pulse.

Note that in order to obtain a symmetrical output clock signal, a symmetrical input clock signal is required; i.e., a clock signal having high and low pulses of about equal duration. An asymmetrical input clock signal results in an asymmetrical output clock signal, and in extreme cases (e.g., where half the high pulse is longer than the low pulse) the circuit does not function properly.

In one embodiment, the clock doubler circuit includes an option to disable the circuit. A disable control signal is applied to the output clock generator to select the input clock signal as the output clock signal. Therefore, no clock doubling is performed.

In another embodiment, the clock doubler circuit includes a preliminary delay stage for the delay line. The preliminary stage comprises a delay element that can selectively add either a full unit delay or a half-unit delay to the input clock signal. Using this additional delay element, the clock doubler circuit can supply a clock more nearly offset by 90 degrees. If the clock pulse spans an odd number of unit delays, the half-unit delay is inserted. If the clock pulse spans an even number of unit delays, a full unit delay is inserted, and the circuit operates as described above. In other embodiments, rather than adding a selectable half/full unit delay element at the beginning of the delay line, the first stage of the delay line is modified to offer a half/full unit delay option, or a full/one-and-a-half unit delay option. As long as corresponding changes are made to the select generation circuitry, as is easily done by those of ordinary skill in the art, any of these or similar changes to the delay line are easily accommodated by the circuits and methods of the invention.

In yet another embodiment, a status generator circuit is provided that provides a status signal after a predetermined number of clock cycles have elapsed. This status signal may be used by other circuits to disable the output clock signal until the output clock signal has settled into a reliably predictable pattern.

An advantage of the invention is that the output clock is always in synchronization with the input clock. Because in the described embodiments the rising edge of the input clock always triggers a rising edge of the output clock, two periods of the output clock are always equivalent to one period of the input clock. There can be no "creeping" (i.e., no offset that increases over time) of the output clock with respect to the input clock.

Another advantage of the invention is that the circuit of the invention can be cascaded, allowing the generation of a 4X clock, an 8X clock, and so forth.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

First Embodiment

Figure 1A:
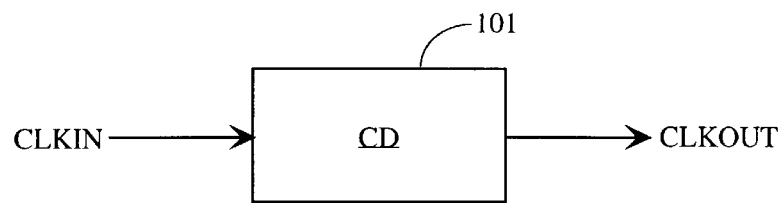
FIG. 1A is a simple block diagram of a clock doubler circuit (CD circuit), showing the input and output signals.
Figure 1B:
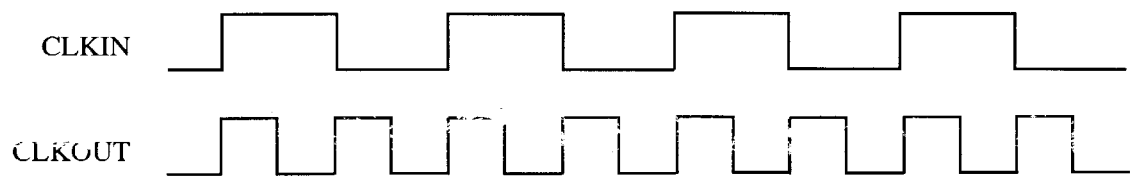
FIG. 1B is a timing diagram showing the interrelationship between the input and output signals of the CD circuit of FIG. 1A.

FIG. 1A is a simple block diagram of a clock doubler circuit (CD circuit) 101, showing the input clock terminal CLKIN and the output clock terminal CLKOUT. FIG. 1B shows the corresponding signals. (In the present specification, the same reference characters are used to refer to terminals, signal lines, and their corresponding signals.) As shown in FIG. 1B, the output clock signal CLKOUT has a frequency twice that of the input clock signal CLKIN. Note that FIG. 1B shows the rising edge of the CLKOUT signal occurring simultaneously with the rising edge of the CLKIN signal, although there is necessarily a delay incurred by passing through the circuit. The timing diagrams herein do not reflect timing delays through the various circuit elements, in order to clarify the functionality of the circuits.

Figure 2:
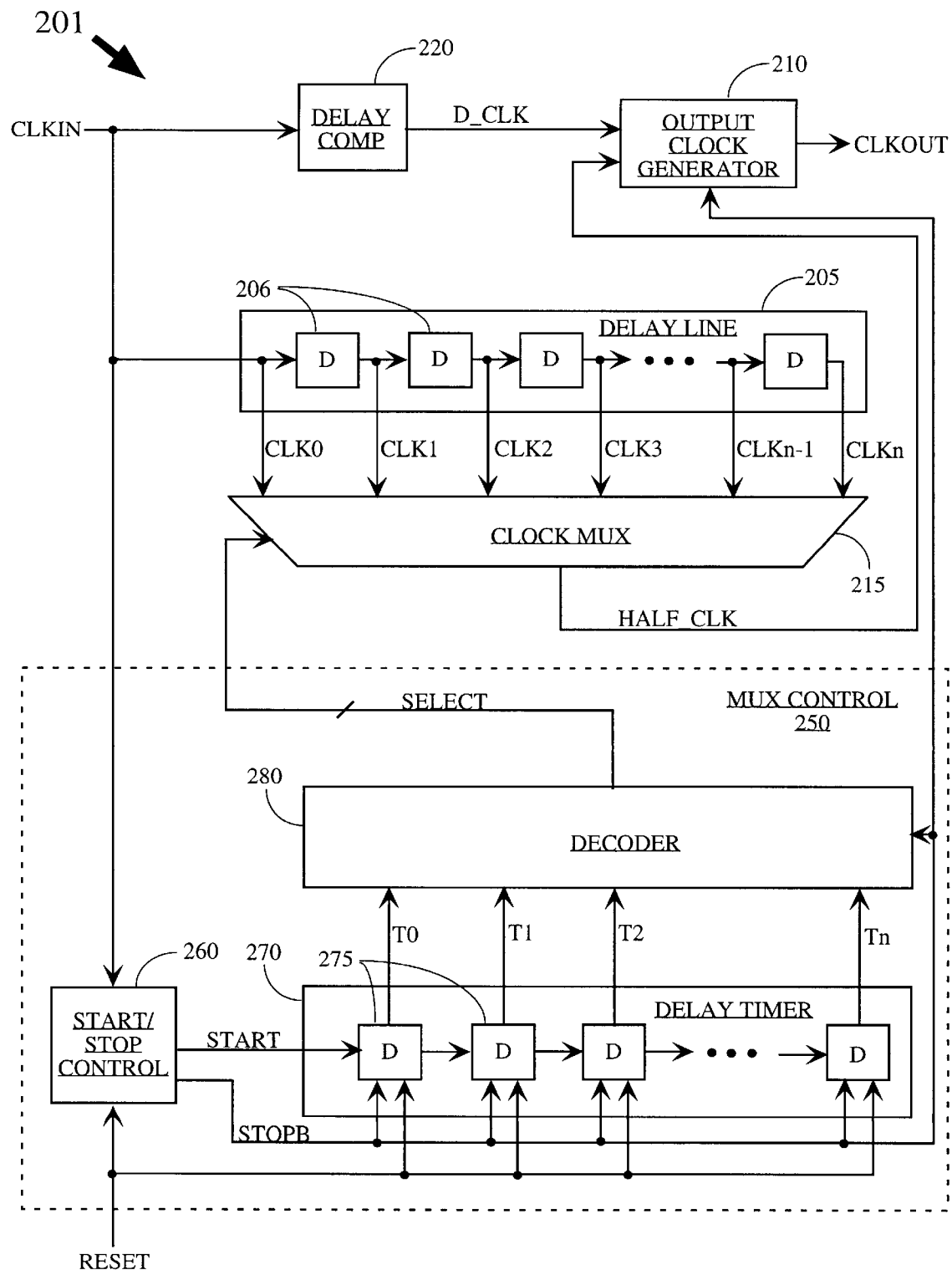
FIG. 2 is a block diagram of a first embodiment of the invention.

FIG. 2 shows a block diagram of CD circuit 201 according to one embodiment of the invention. The CD circuit of FIG. 2 includes a delay line 205, a clock multiplexer 215, a delay compensation element 220, an output clock generator 210, and a multiplexer control circuit 250. An input clock signal CLKIN drives delay compensation element 220 and delay line 205. Delay compensation element 220 delays input clock signal CLKIN by a predetermined time, and passes delayed input clock signal D_CLK to output clock generator 210. Delay line 205 provides from input clock signal CLKIN a plurality of intermediate clock signals (CLK0, CLK1, . . . , CLKn) to clock multiplexer 215, which selects one of the intermediate clock signals and provides the selected signal as signal HALF_CLK to output clock generator 210. Clock multiplexer 215 is controlled by SELECT signals from multiplexer control circuit 250.

Delay line 205 comprises a series of delay elements 206, each having a delay of one "unit delay". A unit delay can be any period of time appropriate to the application of the CD circuit. For example, a unit delay can be measured in tens, hundreds, or thousands of picoseconds, or even longer periods of time, particularly for non-IC applications. Delay line 205 provides a plurality of intermediate clock signals CLK0, CLK1, . . . , CLKn, respectively delayed by 0, 1, . . . , n unit delays from the input clock signal CLKIN.

Clock multiplexer 215 (under control of multiplexer control circuit 250) selects the intermediate clock signal subject to a delay closest to but not exceeding half of one input clock pulse (HALF_CLK), as described below. Meanwhile, input clock signal CLKIN is delayed by an appropriate amount of time by delay compensation element 220 to compensate for the delay through clock multiplexer 215. (Delay compensation element 220 is optional in some cases, for example, where the delay through clock multiplexer 215 is smaller than the unit delay.) Output clock generator 210 then combines the selected clock signal HALF_CLK with the delayed input clock signal D_CLK to provide an output clock signal CLKOUT with the twice the frequency of the input clock signal CLKIN.

An output clock signal CLKOUT having these characteristics is easily generated by performing the exclusive-OR (XOR) function on the delayed input clock signal D_CLK and the selected clock signal HALF_CLK. Therefore, in one embodiment, output clock generator 210 includes an XOR-gate followed by a multiplexer that selects between delayed input clock signal D_CLK and the output signal from the XOR-gate. When the CD circuit is reset, delayed input clock signal D_CLK is passed as the output clock signal. When the CD circuit is active, the output signal from the XOR-gate is passed as the output clock signal.

Multiplexer control circuit 250 is responsible for selecting the correct intermediate clock signal to supply to the output clock generator. In the embodiment of FIG. 2, multiplexer control circuit 250 includes a Start/Stop control circuit 260, a delay timer circuit 270, and a decoder 280. Under control of Start/Stop control circuit 260, delay timer 270 counts the number of unit delays between first (e.g., rising) and second (e.g., falling) edges of input clock signal CLKIN. Decoder 280 effectively divides this number by two, thus supplying the desired number of unit delays required to delay the input clock signal by half the pulse width (90 degrees for a symmetrical input clock). In this embodiment, decoder 280 supplies the select signals to clock multiplexer 215 to select the intermediate clock signal subject to a delay closest to but not exceeding half of one input clock pulse.

In one embodiment, Start/Stop control circuit 260 operates as follows. On the first rising edge of the CLKIN signal, the START signal goes high while the STOP signal remains low (i.e., the STOPB signal remains high). On the first falling edge of the CLKIN signal, the STOP signal goes high (i.e., the STOPB signal goes low), and both START and STOP signals remain high until the circuit is reset. In one embodiment, the signals are reset by a reset signal received from outside the clock doubler circuit.

The START signal feeds into delay timer 270. All stages of delay timer 270 have a low value prior to the START signal going high. In one embodiment, this low value is assured by the same reset signal that is used to reset the START and STOP signals. When the START signal goes high, the high voltage level is passed along the delay chain (from left to right in FIG. 2). Each stage 275 of delay timer 270 has a delay of one unit delay, the same delay as in delay line 205, above. As long as the START signal is high and the STOP signal is low (i.e., for one clock pulse), one additional stage 275 of delay timer 270 goes high for each unit delay. For example, if the clock pulse is m unit delays in length, then m stages 275 of delay timer 270 are high (starting from the left, i.e., bits T0, Ti, . . . , Tm−1 are high) and the rest of the stages are low, when the STOP signal goes high and stops transmission of the START signal from left to right along the delay chain. In one embodiment, the STOP signal is also used to disable the decoder 280 until the delay timer has completed the transmission of the START signal.

In one embodiment, delay timer circuit 270 is implemented as a simple counter. However, the use of a series of unit delays enables the delay through delay timer circuit 270 to closely track the delay through delay line 205. Therefore, in applications where such delays are process-dependent, as in integrated circuits, the illustrated implementations are preferred.

Decoder 280 receives the n+1 bits T0, T1, . . . , Tn from the delay timer. Of the bits with a high value, the central bit is identified and is used to select the correct intermediate clock signal. For example, if there are 30 unit delays in one clock pulse, then the intermediate clock signal delayed by 15 unit delays is selected. If there are an odd number of unit delays in one clock pulse, in this embodiment the "extra" unit delay is ignored. For example, if there are 31 unit delays in one clock pulse, then the intermediate clock signal delayed by 15 unit delays is selected. In the second embodiment, described below in connection with FIG. 4, an additional half-delay is inserted and an intermediate clock signal delayed by 15½ unit delays is selected, more nearly providing an exact 90 degree offset.

In another embodiment (not shown), the intermediate clock signal selected by clock multiplexer 215 is the intermediate clock signal closest to and exceeding half of one input clock pulse. In this embodiment, decoder 280 is simply modified to select the intermediate clock signal delayed by one additional unit delay compared to the previously described embodiment. For example, if there are 31 unit delays in one clock pulse, the intermediate clock signal delayed by 16 unit delays is selected.

Second Embodiment

Figure 3A:
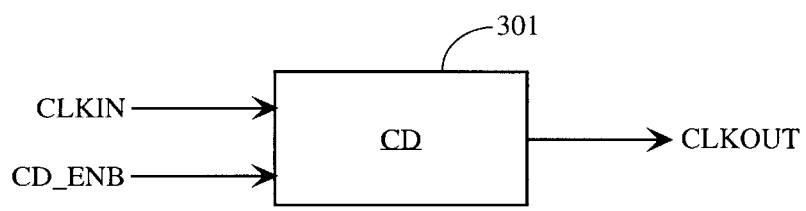
FIG. 3A is a simple block diagram of a CD circuit according to another embodiment of the invention, showing the input and output signals.
Figure 3B:
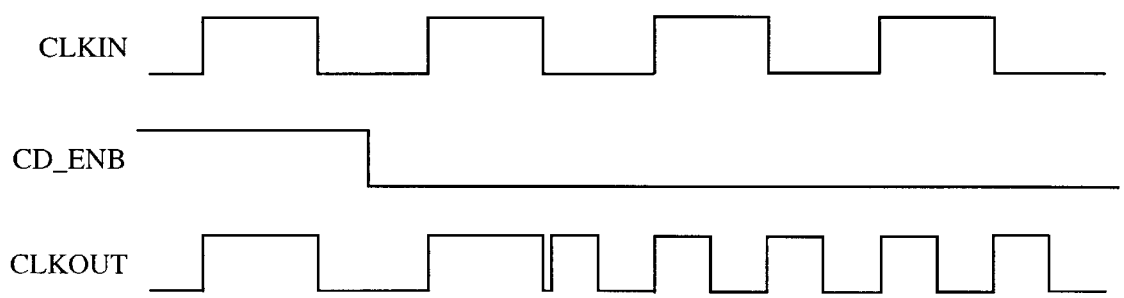
FIG. 3B is a timing diagram showing the interrelationships among the input and output signals of the CD circuit of FIG. 3A.

FIG. 3A is a simple block diagram of a clock doubler circuit (CD circuit) 301 for another embodiment of the invention, showing input clock terminal CLKIN, an active-low enable input terminal CD_ENB, and output clock terminal CLKOUT. FIG. 3B shows the corresponding signals. As shown in FIG. 3B, CD circuit 301 is controlled by enable signal CD_ENB to provide an output clock signal CLKOUT having either the same frequency or twice the frequency of input clock signal CLKIN. (As in FIG. 1B, the delay between signals CLKIN and CLKOUT is not shown.) A delay of one input clock pulse between the time the enable signal is asserted and the time the output clock signal changes is used to measure the duration of the high input clock pulse, as described below. A "glitch" may occur as the clock doubler circuit begins to operate, as shown in FIG. 3B.

Figure 4:
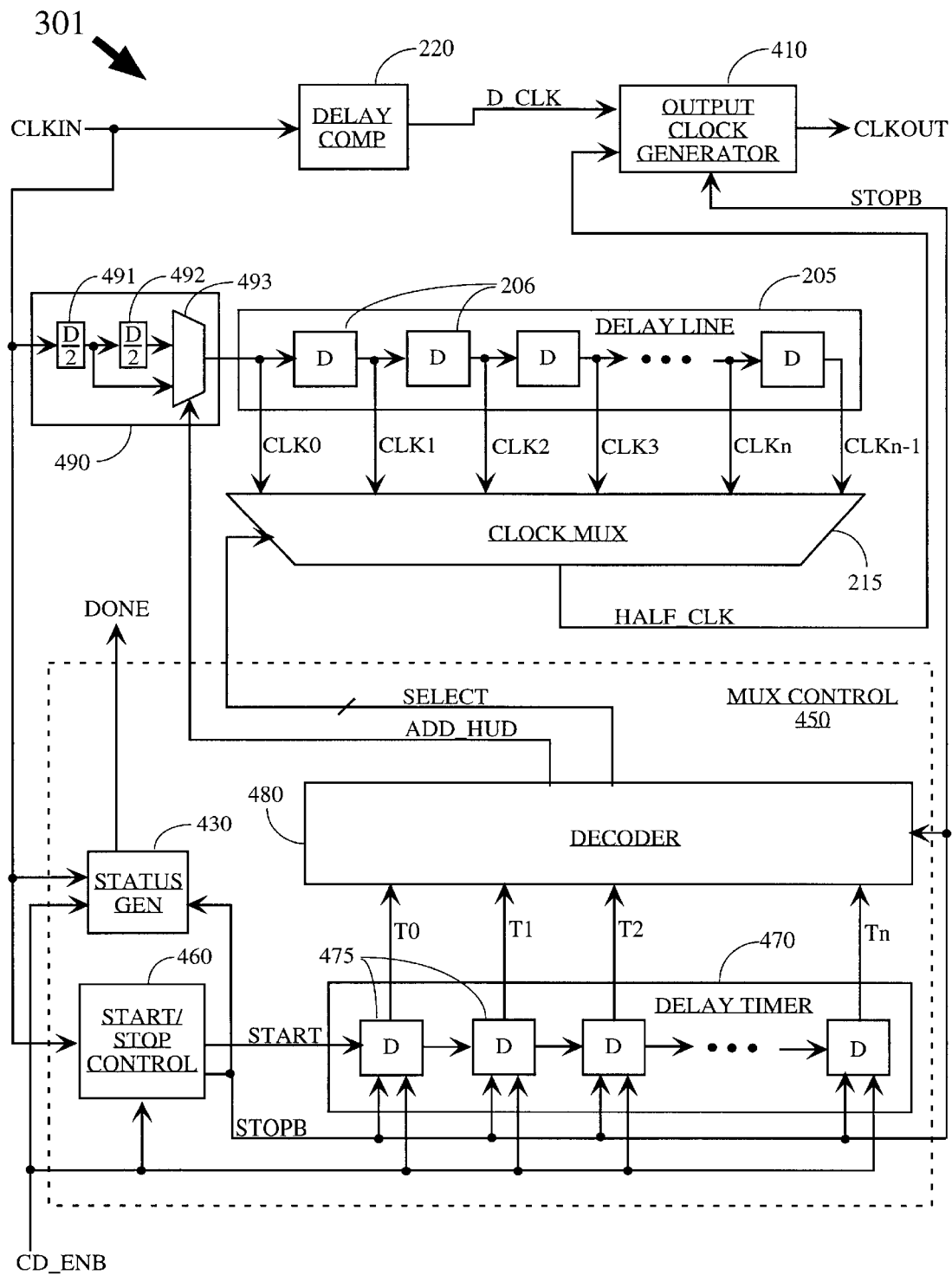
FIG. 4 is a block diagram of a second embodiment of the invention.

FIG. 4 shows a second embodiment of the invention. The embodiment of FIG. 4 includes several optional features not included in the embodiment of FIG. 2. Although these features are all shown in a single embodiment, they can be separately used or omitted, and the resulting circuits fall within the spirit and scope of the invention. The invention includes these and other variations on the basic concepts described herein.

The block diagram shown in FIG. 4 is similar to that of FIG. 2, and therefore is not described in detail here, except where the embodiment of FIG. 4 differs from that of FIG. 2. However, logic blocks that were previously described only in terms of their function are shown in more detail in relation to this embodiment.

Figure 5A:
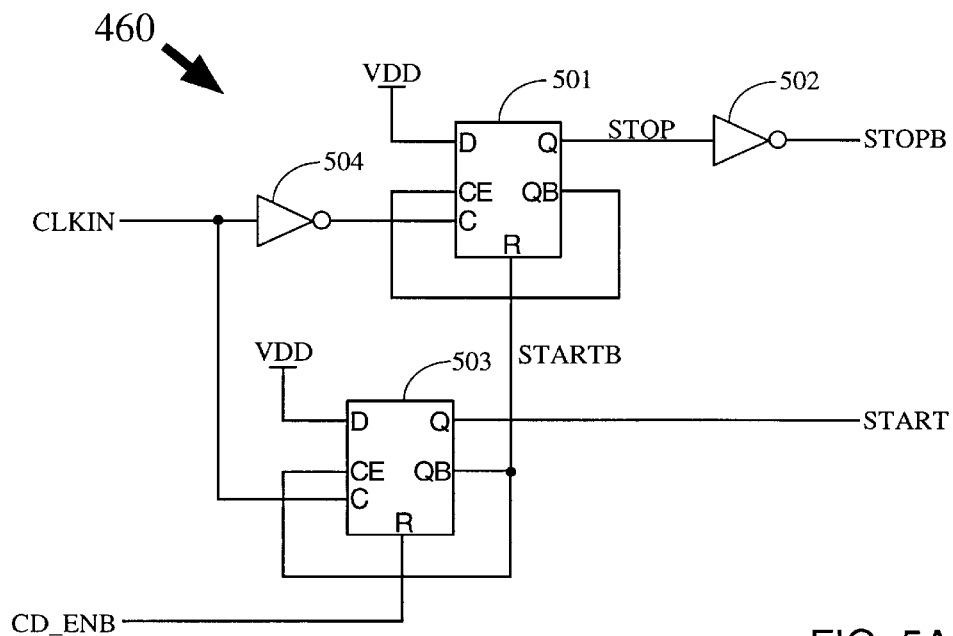
FIG. 5A is a block diagram of a Start/Stop control circuit that can be used with the embodiment of FIG. 4.

FIG. 5A is a block diagram of a Start/Stop control circuit that can be used with the embodiment of FIG. 4. Input signals to the control circuit include input clock signal CLKIN and an enable/disable control signal CD_ENB, which has several functions in the embodiment of FIG. 4. For example, enable/disable control signal CD_ENB provides the reset function for the Start/Stop control circuit. Output signals from Start/Stop control circuit 460 include control signals STOPB and START, which control delay timer 470, decoder 480, output clock generator 410, and status generator 430.

Start/Stop control circuit 460 includes flip-flop 503, which provides control signal START from its non-inverting output terminal Q; inverter 504, flip-flop 501; and inverting buffer 502, which is driven by the non-inverted output terminal Q of flip-flop 501 (signal STOP) and provides control signal STOPB. The data input terminal D of each flip-flop 501, 503 is coupled to a fixed high voltage (VDD). The inverted output terminal QB of each flip-flop is coupled to its corresponding clock enable terminal. Therefore, when the flip-flop stores a high value, the clock terminal is effectively disabled and the value stored in the flip-flop does not change until the flip-flop is reset. Flip-flop 503 (providing the START signal) is clocked by input clock signal CLKIN. Flip-flop 501 (providing the STOPB signal) is clocked by the inverse of signal CLKIN (provided by inverter 504). Flip-flop 503 (providing the START signal) is reset by enable/disable control signal CD_ENB. Flip-flop 501 (providing the STOPB signal) is reset by the signal STARTB, provided by the inverted output terminal QB of flip-flop 503. Therefore, when the value stored in flip-flop 503 (signal START) goes high (i.e., on the first rising edge of input signal CLKIN after enable/disable control signal CD_ENB goes low), the value stored in flip-flop 501 (signal STOP) goes high on the next falling edge of input signal CLKIN. Both flip-flops continue to store a high value until reset.

Figure 5B:
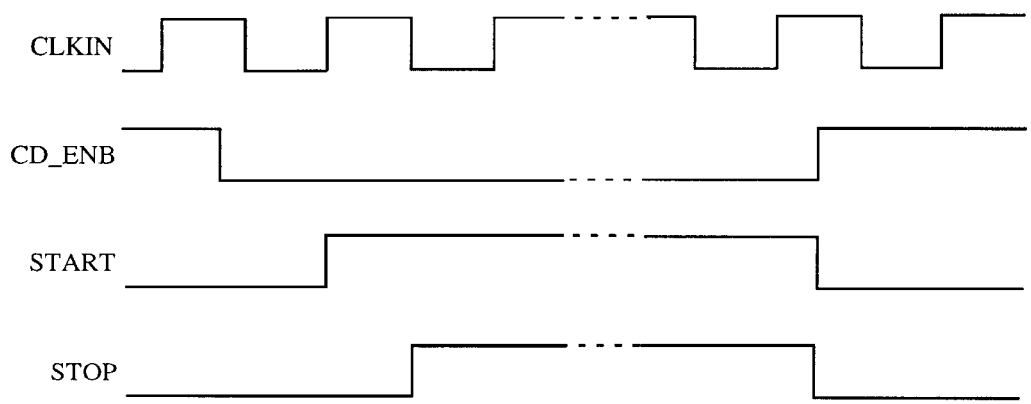
FIG. 5B is a timing diagram showing the interrelationships among the signals of the Start/Stop control circuit shown in FIG. 5A.

FIG. 5B is a timing diagram showing the interrelationships among the signals of the Start/Stop control circuit shown in FIG. 5A. When signal CD_ENB is high, signal CLKIN is ignored. When signal CD_ENB goes low, the next rising edge of signal CLKIN results in signal START going high. On the next falling edge of signal CLKIN, signal STOP goes high. When signal CD_ENB goes high again, both signals START and STOP are reset low, regardless of the state of signal CLKIN.

Figure 6:
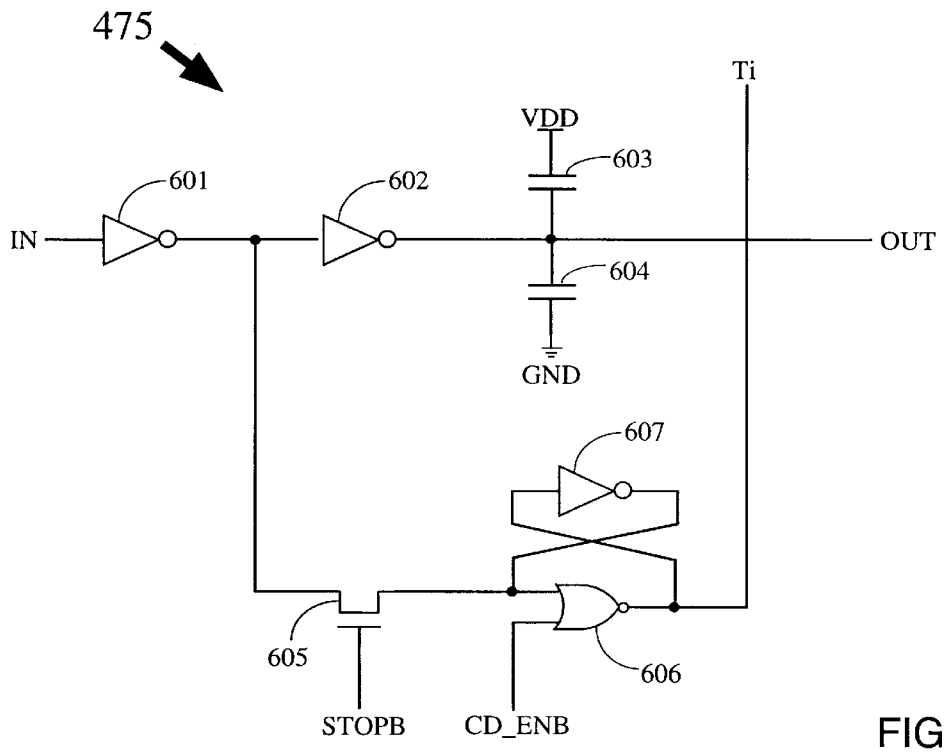
FIG. 6 is a block diagram of a delay element that can be used in the delay timer shown in FIG. 4.

FIG. 6 is a block diagram of a delay element 475 that can be used in delay timer 470 of FIG. 4. Input signal IN is delayed by inverters 601, 602 coupled in series, inverter 602 providing output signal OUT. Capacitor 603 provides a capacitance between output signal OUT and a fixed high voltage (VDD). Capacitor 604 provides a capacitance between output signal OUT and a fixed low voltage (GND). The values of capacitors 603 and 604 are selected such that the delay through delay element 475 is one unit delay, as described above. In one embodiment, the values of capacitors 603 and 604 are programmable, or otherwise adjustable.

The output terminal of inverter 601 is coupled to a first data terminal of a passgate 605, which is controlled by control signal STOPB. The second data terminal of passgate 605 is coupled to a first input terminal of NOR-gate 606 and an output terminal of inverter 607. NOR-gate 606 and inverter 607 are cross-coupled to form a latch. A second input terminal of NOR-gate 606 is coupled to enable/disable control signal CD_ENB. The output terminal of NOR-gate 606 provides a bit Ti to decoder 480, where i=0, 1, ... n (see FIG. 4).

Delay element 206 of delay line 205 is preferably implemented using inverters and capacitors similar to inverters 601, 602 and capacitors 603, 604, so that the delays are similarly affected by processing and other variations.

Decoder 480, clock multiplexer 215, and delay compensator 220 operate as described throughout the specification. Decoders, multiplexers, and delay elements are notoriously well-known. Therefore, detailed descriptions of these elements are not provided herein.

The embodiment of FIG. 4 allows a closer approximation of the 90 degree offset point in the input clock period (e.g., the "halfway" point in the high pulse) than is achievable in the embodiment of FIG. 2. As described above, the halfway point as determined by the embodiment of FIG. 2 suffers in accuracy if the clock pulse is an odd number of unit delays in length. Effectively, when the decoder divides the number of unit delays by two, any "odd" unit delay is lost. The embodiment of FIG. 4 adjusts for this error by providing for an additional half-unit delay that can optionally be added at the beginning of the delay line.

Optional half/full unit delay element 490 (see FIG. 4) comprises two half-unit delay elements 491, 492 connected in series, and a 2-to-1 multiplexer 493 selecting between the output signals from the two half-unit delay elements, i.e., selecting either a half-unit delay (from half-unit delay element 491) or a full-unit delay (from half-unit delay element 492). Half-unit delay elements 491, 492 each delay an input signal by one-half of a unit delay (described above). For purposes of this description, it is assumed that the delay through multiplexer 493 is negligible compared to one unit delay. When the delay is not negligible, the delay through multiplexer 493 is compensated for by appropriately reducing the delay through half-unit delay element 491 or by increasing the delay through delay compensator element 220.

Multiplexer 493 is controlled to add either half or a full-unit delay by an additional control signal ADD_HUD (Add Half-Unit Delay), which is provided by decoder 480. The ADD_HUD signal is generated by effectively counting the number of high bits received from delay timer 470 (as described above with regard to FIG. 2), dividing the number by two, and if there is a remainder selecting the half-unit delay path. Note that the SELECT signals for this embodiment differ from those of the embodiment of FIG. 2, because of the additional delay though optional half/full unit delay element 490.

As described above, the embodiment of FIG. 4 uses an enable/disable control signal CD_ENB. When control signal CD_ENB is high, the CD circuit is disabled, and provides an output clock signal that is simply a delayed version of the input clock signal. In other words, the frequency of the output clock signal is the same as that of the input clock signal. When signal CD_ENB is low, CD circuit 301 is enabled, and provides an output clock signal CLKOUT with twice the frequency of the input clock signal.

In the embodiment of FIG. 4, this enable/disable capability is provided by supplying the STOPB signal (which is set high by enable/disable control signal CD_ENB) to output clock generator 410. Output clock generator 410 includes an output multiplexer controlled by the STOPB signal, which simply selects the delayed input clock signal D_CLK as output clock signal CLKOUT, rather than selecting the output clock signal with twice the input frequency.

Figure 7A:
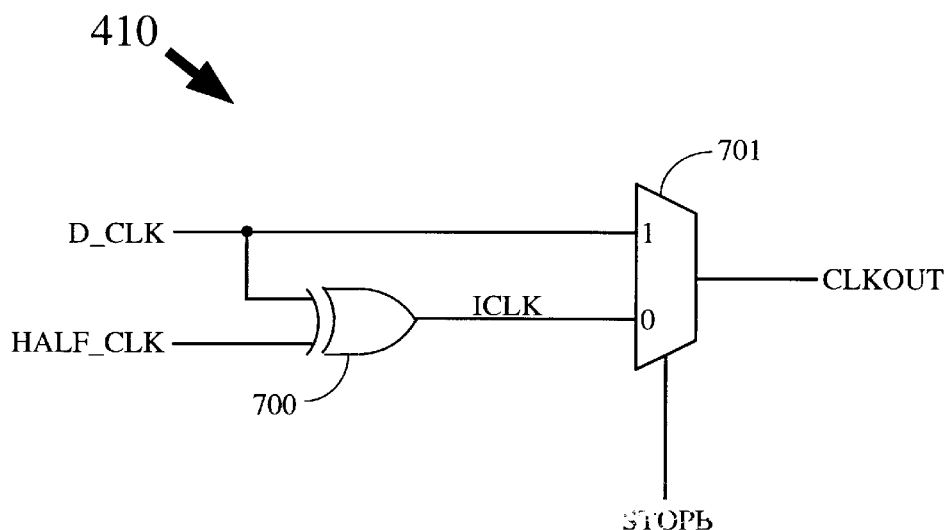
FIG. 7A is a block diagram of an output clock generator that can be used with the embodiment of FIG. 4.

FIG. 7A is a block diagram of an output clock generator that can be used with the embodiment of FIG. 4. Delayed input clock signal D_CLK drives a first input terminal of XOR-gate 700, while selected clock signal HALF_CLK drives the other input terminal. An intermediate signal ICLK is provided by the XOR-gate 700. One of delayed clock signal D_CLK and signal ICLK is selected in output multiplexer 701, which provides output clock signal CLKOUT. When signal STOPB is high, signal D_CLK is selected. When signal STOPB is low, signal ICLK is selected.

In another embodiment (not shown), input clock signal CLKIN is provided to output multiplexer 701 instead of delayed input clock signal D_CLK. This modification removes the delay caused by delay compensator 220, therefore, output clock signal CLKOUT more nearly follows input clock signal CLKIN.

Figure 7B:
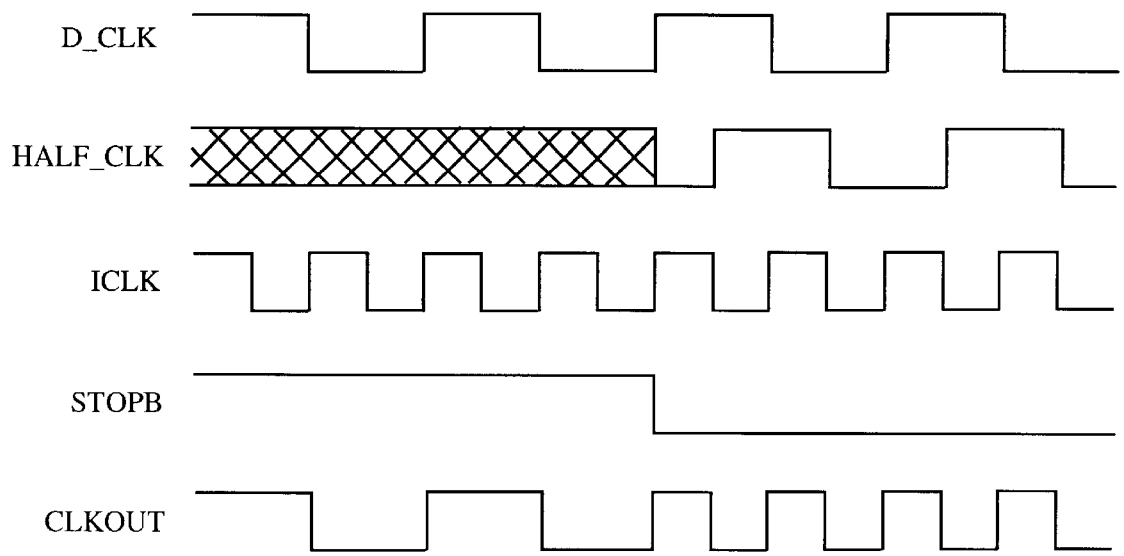
FIG. 7B is a timing diagram showing the interrelationships among the signals of the output clock generator shown in FIG. 7A.

FIG. 7B is a timing diagram showing the interrelationships among the signals of the output clock generator shown in FIG. 7A. As shown in FIG. 7B, signal D_CLK is a periodic clock signal. When signal STOPB is high, signal HALF_CLK may be any value ("don't-care"), as shown by the crosshatching in FIG. 7B. (In one embodiment, signal HALF_CLK is held low when the clock doubler circuit is reset, and remains low until signal STOPB goes low.) When signal STOPB is low, signal HALF_CLK is a periodic signal with the same frequency as signal D_CLK but delayed by about half a clock pulse. Signal ICLK goes low whenever signal HALF_CLK changes state, and goes high whenever signal D_CLK changes state. When signal STOPB is high, output clock signal CLKOUT follows signal D_CLK. When signal STOPB is low, output clock signal CLKOUT follows signal ICLK.

Figure 8:
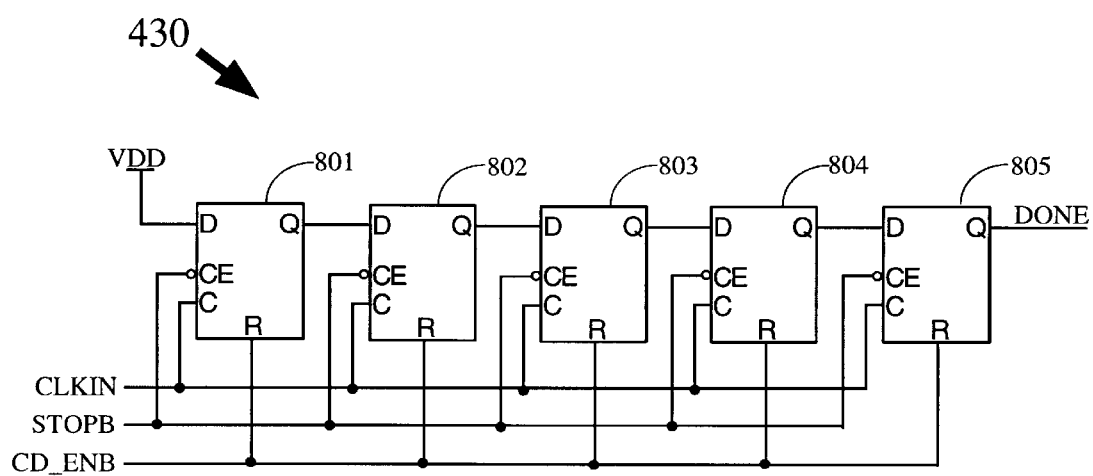
FIG. 8 is a block diagram of a status generator circuit that can be used in the embodiment of FIG. 4.

The embodiment of FIG. 4 also includes a status generator circuit 430 that provides a status signal DONE after a predetermined number of input clock cycles have elapsed. FIG. 8 shows an example of such a status circuit. Status generator circuit 430 includes a plurality of flip-flops 801–805 coupled in series and clocked by the input clock signal CLKIN. The data input terminal D of the first flip-flop is coupled to a high voltage (VDD). The flip-flops are reset by a high value on the CD_ENB signal, and enabled by a low value on the STOPB signal. Therefore, when the CD circuit is first enabled, all flip-flops store a low value, and status signal DONE is low. Status signal DONE is optionally used by other circuits to disable the output clock signal CLKOUT until the output clock signal has settled into a reliably predictable pattern. The number of flip-flops in status generator circuit 430 can be any integer, depending on the anticipated number of clock cycles required for the output clock signal to settle.

On the first rising edge of the CLKIN signal, flip-flop 801 goes high. On each succeeding edge, one more flip-flop goes high. After five rising edges on input clock signal CLKIN, the status signal DONE goes high. If the STOPB signal goes high (and remains high) after less than five clock cycles, then DONE does not go high. In other embodiments, the status generator circuit is omitted or is otherwise implemented, for example, using a counter.

Those having skill in the relevant arts of the invention will now perceive various modifications and additions that may be made as a result of the disclosure herein. For example, the above text describes the invention in the context of ICs. However, the invention can also be applied to many other systems. Further, clock generators, delay compensators, delay elements, unit delays, delay lines, delay timers, multiplexers, decoders, status generators, and control circuits other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A clock doubler circuit, comprising:
   an input clock terminal providing an input clock signal having an input clock frequency;
   a delay line driven by the input clock signal and providing a plurality of intermediate clock signals delayed from the input clock signal by a plurality of unit delays;
   a multiplexer control circuit comprising a delay timer and a decoder;
   a clock multiplexer selecting among the intermediate clock signals under control of the multiplexer control circuit to provide a selected clock signal, the selected clock signal being an intermediate clock signal subject to a selected delay about equal to half of one input clock pulse; and
   an output clock generator driven by the selected clock signal and the input clock signal and providing an output clock signal having an output clock frequency that is twice the input clock frequency.

2. The clock doubler circuit of claim 1, wherein the selected delay comprises a number of unit delays closest to but not exceeding half of one input clock pulse.

3. The clock doubler circuit of claim 1, wherein the selected delay comprises a number of unit delays closest to and exceeding half of one input clock pulse.

4. The clock doubler circuit of claim 1, further comprising a delay compensation element having a delay equal to a delay through the clock multiplexer, the delay compensation element being coupled between the input clock terminal and the output clock generator.

5. The clock doubler circuit of claim 1, further comprising an enable/disable control terminal coupled to the multiplexer control circuit and providing an enable/disable control signal to the multiplexer control circuit, and wherein:
   when the enable/disable control signal is at a first logic level, the output clock generator provides the output clock signal having an output clock frequency that is twice the input clock frequency, and
   when the enable/disable control signal is at a second logic level, the output clock generator provides an output clock signal having an output clock frequency the same as the input clock frequency.

6. The clock doubler circuit of claim 5, further comprising a status generation circuit driven by the input clock signal and providing a status signal, the status signal indicating when a predetermined number of input clock periods have elapsed since the clock doubler circuit was enabled.

7. The clock doubler circuit of claim 1, wherein the multiplexer control circuit comprises:
   a delay timer comprising a series of delay elements each having a delay equal to the unit delay of the delay line, the delay timer providing a series of bits indicative of the number of unit delays in one input clock pulse; and
   a decoder that receives the series of bits and provides therefrom a plurality of select signals for controlling the clock multiplexer.

8. The clock doubler circuit of claim 7, wherein:
   the multiplexer control circuit further comprises a start/stop control circuit, the start/stop control circuit providing to the delay timer a first signal responsive to a first edge of the input clock signal, and a second signal responsive to a second edge of the input clock signal, the second edge being opposite to the first edge; and
   the first and second signals enable the delay timer to count the number of unit delays between the first and second edges of the input clock signal.

9. The clock doubler circuit of claim 1, wherein the delay line comprises a delay element selectably providing half of the unit delay, thereby delaying each of the plurality of intermediate clock signals by half of the unit delay.

10. A method of doubling the frequency of an input clock signal, the method comprising:
    receiving an input clock signal having an input clock frequency;
    providing from the input clock signal a plurality of intermediate clock signals delayed from the input clock signal by a plurality of unit delays;
    selecting from among the intermediate clock signals a selected clock signal, the selected clock signal being an intermediate clock signal subject to a selected delay about equal to half of one input clock pulse; and
    providing from the selected clock signal and the input clock signal an output clock signal having an output clock frequency that is twice the input clock frequency.

11. The method of claim 10, wherein the selected delay comprises a number of unit delays closest to but not exceeding half of one input clock pulse.

12. The method of claim 10, wherein the selected delay comprises a number of unit delays closest to and exceeding half of one input clock pulse.

13. The method of claim 10, wherein providing an output clock signal comprises delaying the input clock signal by a delay equal to a delay incurred while selecting from among the intermediate clock signals.

14. The method of claim 10, further comprising:
    providing an enable/disable control signal;
    when the enable/disable control signal is at a first logic level, providing from the selected clock signal and the input clock signal an output clock signal having an output clock frequency that is twice the input clock frequency; and
    when the enable/disable control signal is at a second logic level, providing an output clock signal having an output clock frequency the same as the input clock frequency.

15. The method of claim 14, further comprising providing a status signal, the status signal indicating when a predetermined number of input clock periods have elapsed since the enable/disable control signal was changed to the first logic level.

16. The method of claim 10, wherein selecting from among the intermediate clock signals a selected clock signal comprises:
    counting a number of unit delays in one input clock pulse; and
    decoding the number of unit delays to select from among the intermediate clock signals the selected clock signal.

17. The method of claim 16, wherein counting a number of unit delays in one input clock pulse comprises:
    providing a first control signal responsive to a first edge of the input clock signal;
    providing a second control signal responsive to a second edge of the input clock signal, the second edge being opposite to the first edge; and counting the number of unit delays between the first and second edges of the input clock signal.

18. The method of claim 10, wherein providing from the input clock signal a plurality of intermediate clock signals delayed from the input clock signal by a plurality of unit delays further comprises selectably delaying each of the plurality of intermediate clock signals by half of the unit delay.

19. A clock doubler circuit, comprising:

means for receiving an input clock signal having an input clock frequency;

means for providing from the input clock signal a plurality of intermediate clock signals delayed from the input clock signal by a plurality of unit delays;

means for selecting from among the intermediate clock signals a selected clock signal, the selected clock signal being an intermediate clock signal subject to a selected delay about equal to half of one input clock pulse; and means for providing from the selected clock signal and the input clock signal an output clock signal having an output clock frequency that is twice the input clock frequency.

20. The clock doubler circuit of claim 19, wherein the selected delay comprises a number of unit delays closest to but not exceeding half of one input clock pulse.

21. The clock doubler circuit of claim 19, wherein the selected delay comprises a number of unit delays closest to and exceeding half of one input clock pulse.

22. The clock doubler circuit of claim 19, wherein the means for providing an output clock signal comprises means for delaying the input clock signal by a delay equal to a delay incurred while selecting from among the intermediate clock signals.

23. The clock doubler circuit of claim 19, further comprising:

means for providing an enable/disable control signal;

means for providing, when the enable/disable control signal is at a first logic level, from the selected clock signal and the input clock signal an output clock signal having an output clock frequency that is twice the input clock frequency; and means for providing, when the enable/disable control signal is at a second logic level, an output clock signal having an output clock frequency the same as the input clock frequency.

24. The clock doubler circuit of claim 23, further comprising means for providing a status signal, the status signal indicating when a predetermined number of input clock periods have elapsed since the enable/disable control signal was changed to the first logic level.

25. The clock doubler circuit of claim 19, wherein the means for selecting from among the intermediate clock signals a selected clock signal comprises:

means for counting a number of unit delays in one input clock pulse; and means for decoding the number of unit delays to select from among the intermediate clock signals the selected clock signal.

26. The clock doubler circuit of claim 25, wherein the means for counting a number of unit delays in one input clock pulse comprises:

means for providing a first control signal responsive to a first edge of the input clock signal;

means for providing a second control signal responsive to a second edge of the input clock signal, the second edge being opposite to the first edge; and means for counting the number of unit delays between the first and second edges of the input clock signal.

27. The clock doubler circuit of claim 19, wherein the means for providing from the input clock signal a plurality of intermediate clock signals delayed from the input clock signal by a plurality of unit delays further comprises means for selectably delaying each of the plurality of intermediate clock signals by half of the unit delay.

* * * * *